US008907406B2

(12) United States Patent
Ota et al.

(10) Patent No.: US 8,907,406 B2
(45) Date of Patent: Dec. 9, 2014

(54) TRANSISTOR HAVING IMPURITY DISTRIBUTION CONTROLLED SUBSTRATE AND METHOD OF MANUFACTURING THE SAME

(71) Applicants: Kensuke Ota, Kanagawa (JP); Toshinori Numata, Herverlee (BE); Masumi Saitoh, Kanagawa (JP); Chika Tanaka, Kanagawa (JP); Yusuke Higashi, Kanagawa (JP)

(72) Inventors: Kensuke Ota, Kanagawa (JP); Toshinori Numata, Herverlee (BE); Masumi Saitoh, Kanagawa (JP); Chika Tanaka, Kanagawa (JP); Yusuke Higashi, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 14 days.

(21) Appl. No.: 13/729,959

(22) Filed: Dec. 28, 2012

(65) Prior Publication Data

US 2013/0240828 A1 Sep. 19, 2013

(30) Foreign Application Priority Data

Mar. 13, 2012 (JP) ................................ 2012-056326

(51) Int. Cl.
*H01L 29/66* (2006.01)
*H01L 29/786* (2006.01)
(Continued)

(52) U.S. Cl.
CPC .......... *H01L 29/32* (2013.01); *H01L 29/78696* (2013.01); *H01L 29/78603* (2013.01);
(Continued)

(58) Field of Classification Search
None
See application file for complete search history.

(56) References Cited

U.S. PATENT DOCUMENTS 5,926,703 A * 7/1999 Yamaguchi et al. .......... 438/163
6,391,752 B1 * 5/2002 Colinge et al. ................ 438/585
(Continued)

FOREIGN PATENT DOCUMENTS

JP 2000-196089 7/2000
WO WO 2011/067821 A1 6/2011

OTHER PUBLICATIONS

Jiezhi Chen et al., "Experimental Study of Mobility in [110]- and [100]-Directed Multiple Silicon Nanowire GAA MOSFETs on (100) SOI", 2008 Symposium on VLSI Technology Digest of Technical Papers, 2008 IEEE, pp. 32-33.
Notification of Reason(s) for Refusal issued by the Japanese Patent Office on Sep. 17, 2013, for Japanese Patent Application No. 2012-056326, and English-language translation thereof.

*Primary Examiner* — Andres Munoz
(74) *Attorney, Agent, or Firm* — Finnegan, Henderson, Farabow, Garrett & Dunner, L.L.P.

(57) ABSTRACT

A semiconductor device according to embodiments includes a semiconductor substrate, a buried insulating layer which is formed on the semiconductor substrate, a semiconductor layer which is formed on the buried insulating layer and includes a narrow portion and two wide portions which are larger than the narrow portion in width and are respectively connected to one end and the other end of the narrow portion, a gate insulating film which is formed on a side surface of the narrow portion, and a gate electrode formed on the gate insulating film. The impurity concentration of the semiconductor substrate directly below the narrow portion is higher than the impurity concentration of the narrow portion, and the impurity concentration of the semiconductor substrate directly below the narrow portion is higher than the impurity concentration of the semiconductor substrate directly below the wide portion.

10 Claims, 10 Drawing Sheets

(51) Int. Cl.
  *H01L 29/06* (2006.01)
  *H01L 29/32* (2006.01)
  *B82Y 40/00* (2011.01)
  *H01L 29/775* (2006.01)
  *H01L 29/78* (2006.01)
  *B82Y 10/00* (2011.01)

(52) U.S. Cl.
  CPC ............ *H01L 29/0673* (2013.01); *B82Y 40/00* (2013.01); *H01L 29/775* (2013.01); *H01L 29/785* (2013.01); *B82Y 10/00* (2013.01); *H01L 29/66439* (2013.01); *H01L 29/66795* (2013.01)
  USPC ............ 257/328; 257/402; 438/156; 438/268

(56) References Cited

U.S. PATENT DOCUMENTS

| | | | |
|---|---|---|---|
| 6,437,405 B2 * | 8/2002 | Kim | 257/347 |
| 6,835,609 B1 * | 12/2004 | Lee et al. | 438/183 |
| 6,876,037 B2 * | 4/2005 | Wei et al. | 257/347 |
| 6,998,676 B2 * | 2/2006 | Kondo et al. | 257/329 |
| 7,259,428 B2 * | 8/2007 | Inaba | 257/347 |
| 2005/0145941 A1 * | 7/2005 | Bedell et al. | 257/348 |
| 2008/0237655 A1 * | 10/2008 | Nakabayashi et al. | 257/255 |
| 2009/0242987 A1 * | 10/2009 | Van Dal et al. | 257/347 |
| 2012/0235152 A1 | 9/2012 | Ota et al. | |
| 2012/0282743 A1 | 11/2012 | Saitoh et al. | |
| 2012/0299100 A1 | 11/2012 | Ota et al. | |

* cited by examiner

A-A CROSS SECTION

B-B CROSS SECTION

C-C CROSS SECTION

A-A CROSS SECTION

B-B CROSS SECTION

C-C CROSS SECTION

B-B CROSS SECTION

C-C CROSS SECTION

B-B CROSS SECTION

C-C CROSS SECTION

C-C CROSS SECTION

B-B CROSS SECTION

B-B CROSS SECTION

TRANSISTOR HAVING IMPURITY DISTRIBUTION CONTROLLED SUBSTRATE AND METHOD OF MANUFACTURING THE SAME

CROSS-REFERENCE TO RELATED APPLICATION

This application is based upon and claims the benefit of priority from Japanese Patent Application No. 2012-056326, filed on Mar. 13, 2012, the entire contents of which are incorporated herein by reference.

FIELD

Embodiments described herein relate generally to a semiconductor device and a method of manufacturing the same.

BACKGROUND

As a structure for realizing a scaled down MOSFET having a gate length of 30 nm or less, a nanowire-type channel transistor (nanowire transistor) instead of the planar transistor is expected. Because, the nanowire-type channel transistor is capable of suppressing a short channel effect. The nanowire transistor, for example, is provided with a silicon substrate, a buried dioxide film formed on the silicon substrate, a semiconductor layer including one or more plate-shaped silicon nanowires serving as a channel region formed on the buried dioxide film, a gate insulating film formed on a side surface and an upper surface of the nanowire, a gate electrode formed on the gate insulating film, gate sidewalls formed on both sides (a gate length direction) of the gate electrode, and a source region and a drain region which are formed on a wide portion of the semiconductor layer and the nanowire so as to interpose the channel region.

In the nanowire, the region which includes the gate electrode formed on the upper portion thereof serves as the channel region. The channel region is configured to have a plate shape in which the width (the length in the gate width direction) is about 3 nm to 25 nm and the height thereof is about 3 nm to 40 nm. Since the channel region is covered by the gate electrode, the influence of an electric field applied by the gate electrode is strong and the short channel effect can be suppressed. The nanowire transistor is also referred to as a tri-gate transistor since total three surfaces (the upper surface and both side surfaces) of the nanowire operate as channels.

In order to put the nanowire transistor to practical use, there is a need to adjust a threshold voltage thereof. A method of controlling an impurity concentration of the channel region can be considered as a method of adjusting the threshold voltage. In addition, controlling the work function of the gate electrode by appropriately selecting the impurity concentration and a material of the gate electrode can be considered.

However, if the impurity is excessively introduced to the channel region, a decrease in on-state current caused by scattering of charge carriers due to the impurity and a variability in the threshold voltage caused by a variability in the impurity concentration become issues. In addition, as for the selection in the impurity concentration of the gate electrode and the material of the gate electrode, since there are some constraints on ease of manufacturing process, consistency with the process after the formation of the gate electrode, and the like, it is difficult to find out an optimal solution.

DETAILED DESCRIPTION

Figure 1:
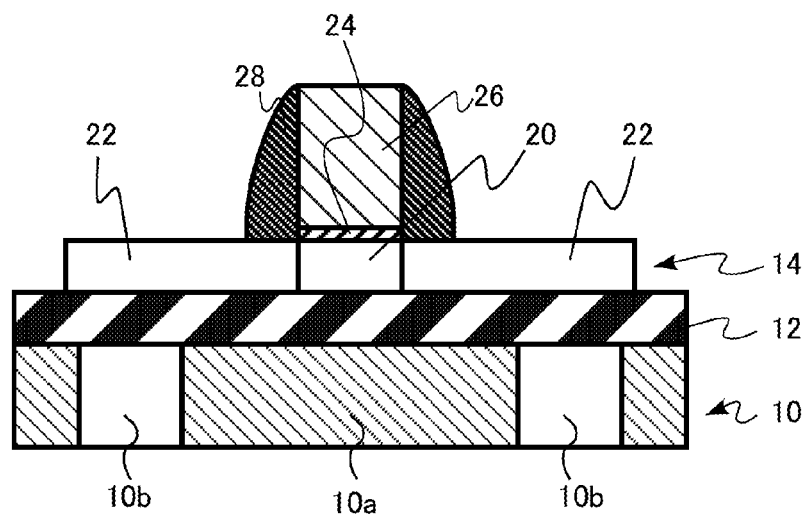
FIG. 1 is a cross-sectional view illustrating a semiconductor device according to a first embodiment.

A semiconductor device according to embodiments includes a semiconductor substrate, a buried insulating layer which is formed on the semiconductor substrate, a semiconductor layer which is formed on the buried insulating layer and includes a narrow portion and two wide portions which are larger than the narrow portion in width and are connected to one end and the other end of the narrow portion, a gate insulating film which is formed on at least side surfaces of the narrow portion, and a gate electrode formed on the gate insulating film, in which the impurity concentration of the semiconductor substrate directly below the narrow portion is higher than the impurity concentration of the narrow portion, and the impurity concentration of the semiconductor substrate directly below the narrow portion is higher than the impurity concentration of the semiconductor substrate directly below the wide portions.

Hereinbelow, embodiments will be described with reference to the drawings.

Further, in the specification, an "impurity concentration" of a predetermined region such as "the semiconductor substrate directly under the narrow portion", "the narrow portion", and "the semiconductor substrate directly below the wide portion" is assumed to represent a maximum impurity concentration in the approximate center portion of the region. For example, the semiconductor substrate directly below the wide portion is assumed to be provided with a rectangular shape when it is projected to a plane parallel to the substrate. In this case, the maximum impurity concentration at a position corresponding to the approximate center portion of the rectangular shape is assumed as an impurity concentration of the semiconductor substrate directly below the wide portion. Further, more strictly, the approximate center portion of a region represents a geographic center of gravity according to the shape of the region.

(First Embodiment)

A semiconductor device according to the embodiment is provided with a semiconductor substrate, a buried insulating layer which is formed on the semiconductor substrate, a semiconductor layer which is formed on the buried insulating layer and includes a narrow portion and two wide portions which are larger than the narrow portion in width and are connected to one end and the other end of the narrow portion, a gate insulating film which is formed on at least side surfaces of the narrow portion, and a gate electrode formed on the gate insulating film. The impurity concentration of the semiconductor substrate directly below the narrow portion is higher than the impurity concentration of the narrow portion. In addition, the impurity concentration of the semiconductor substrate directly below the narrow portion is higher than the impurity concentration of the semiconductor substrate directly below the wide portion.

The semiconductor device according to the embodiment is provided with a so-called nanowire transistor. Hereinbelow, in particular, an n-type nanowire transistor will be given as an example in which electrons serve as carriers.

Figure 2:
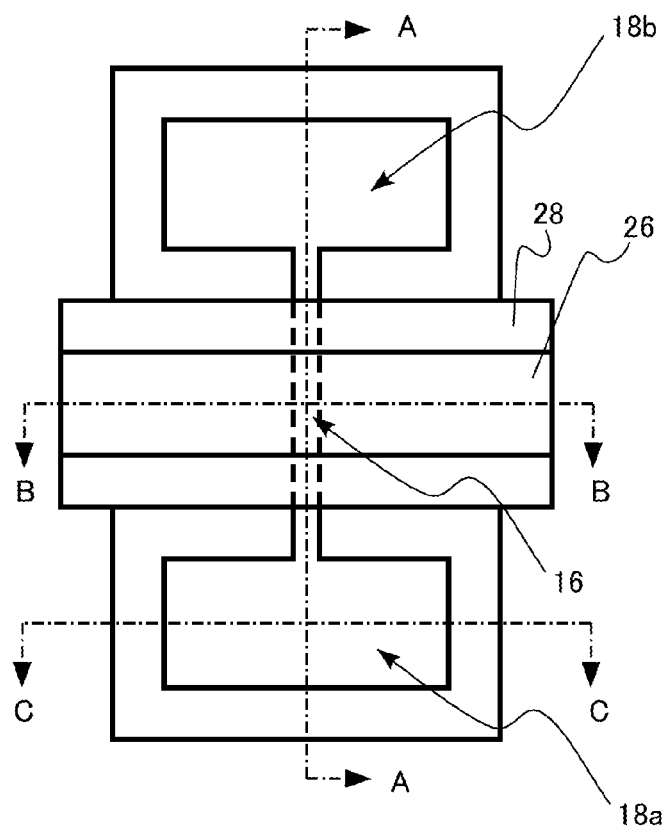
FIG. 2 is a top view illustrating the semiconductor device according to the first embodiment.
Figure 3:
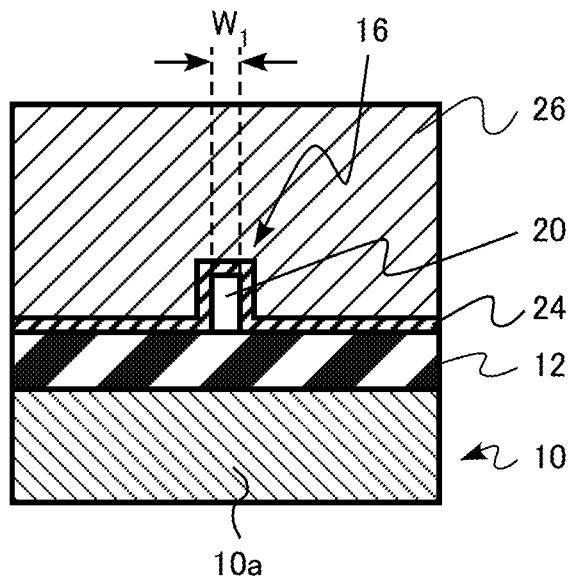
FIG. 3 is a cross-sectional view illustrating a B-B cross section of FIG. 2.
Figure 4:
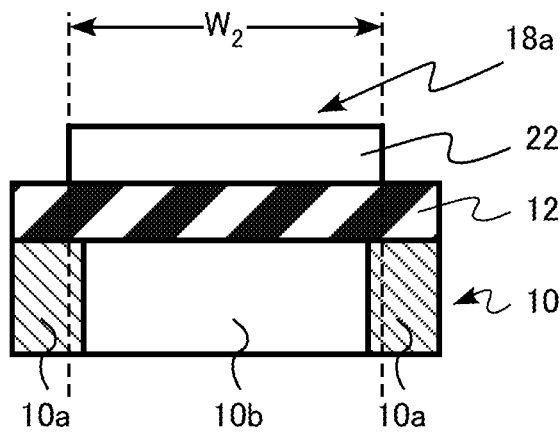
FIG. 4 is a cross-sectional view illustrating a C-C cross section of FIG. 2.
Figure 5:
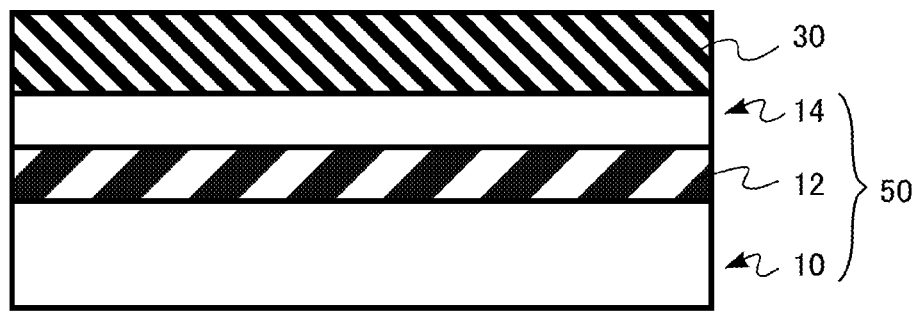
FIG. 5 is a diagram illustrating a procedure in a method of manufacturing the semiconductor device according to the first embodiment.

FIG. 1 is a cross-sectional view illustrating the semiconductor device according to the embodiment. FIG. 2 is a top view illustrating the semiconductor device according to the embodiment. FIG. 1 is a cross-sectional view illustrating an A-A cross section of FIG. 2. The A-A cross section is a cross section in a gate length direction. FIG. 3 is a cross-sectional view illustrating a B-B cross section of FIG. 2. The B-B cross section is a cross section of the gate electrode portion in a gate width direction. FIG. 4 is a cross-sectional view illustrating a C-C cross section of FIG. 2. The C-C cross section is a cross section of a source-drain region in the gate width direction. Even in the subsequent drawings, it will be assumed that the A-A cross section represents the cross section in the gate length direction, the B-B cross section represents the cross section of the gate electrode portion in the gate width direction, and the C-C cross section represents the cross section of the source-drain region in the gate width direction.

The nanowire transistor according to the embodiment is provided with a semiconductor substrate 10, a buried insulating layer 12 which is formed on the semiconductor substrate 10, and a semiconductor layer 14 which is formed on the buried insulating layer 12.

The semiconductor substrate 10, for example, (100)-plane silicon substrate of a p-type.

The buried insulating layer 12 is an insulator which electrically insulates the semiconductor substrate 10 from the semiconductor layer 14. The buried insulating layer 12, for example, is a silicon oxide film. The film thickness of the buried insulating layer, for example, is 3 nm or more and 50 nm or less.

The semiconductor layer 14, for example, is made of p-type single-crystal silicon. Further, the semiconductor layer 14 is not limited to the single-crystal silicon, and polycrystalline silicon or amorphous silicon may be employed. In addition, the semiconductor layer 14 is not limited to the silicon (Si), but a semiconductor such as germanium (Ge), silicon carbide (SIC), silicon germanide (SiGe) may be employed.

The semiconductor layer 14 is provided with a narrow portion 16 and two wide portions 18a and 18b which are formed larger than the narrow portion 16 in width and are connected to one end and the other end of the narrow portion 16.

The narrow portion 16 is a plate-shaped semiconductor which is a so-called nanowire. A channel region 20 of the nanowire transistor is formed on a part of the nanowire.

Further, the width of the narrow portion 16 represents a width in a direction perpendicular to a gate length (a channel length) direction. The width of the narrow portion 16 is a length corresponding to $W_1$ denoted in FIG. 3. The width of the narrow portion 16, for example, is 1 nm or more and 25 nm or less. In addition, the height of the narrow portion 16, for example, is 1 nm or more and 40 nm or less. The channel region 20 is a p-type region, and the p-type impurity concentration thereof, for example, is $5E15$ $cm^{-3}$ or more and $1E18$ $cm^{-3}$ or less.

In addition, the two wide portions 18a and 18b become source-drain regions 22 of the nanowire transistor. The widths of the wide portions 18a and 18b represent widths in a direction perpendicular to the gate length (the channel length) direction. The widths of the wide portions 18a and 18b are lengths corresponding to $W_2$ denoted in FIG. 4.

Further, the lengths of the wide portions 18a and 18b in the gate length (the channel length) direction are also larger than the width of the narrow portion 16. The source-drain region 22, for example, is formed of an n-type diffusion layer, and an n-type impurity concentration thereof, for example, is $1E19$ $cm^{-3}$ or more and $1E21$ $cm^{-3}$ or less.

The channel region 20 is interposed between the source-drain regions 22.

A metal silicide layer or a metal layer (not illustrated) may be formed on the source-drain region 22.

Then, a gate insulating film 24 is formed such that at least the side surfaces and the upper surface of the channel region 20 of the narrow portion 16 are covered.

The gate insulating film 24, for example, is the silicon oxide film. In addition, the gate insulating film 24 is not limited to the silicon oxide film, and a silicon oxynitride film, a high-permittivity film (a high-k film) such as hafnium oxide film and zirconium oxide film, or a laminated film which is formed of the silicon oxide film and the high-permittivity film may be employed.

A gate electrode 26 is formed on the gate insulating film 24. The gate electrode 26, for example, is a polycrystalline silicon layer.

The gate electrode 26 is not limited to the polycrystalline silicon layer, and for example, the laminated structure of the metal silicide layer may be employed. The metal silicide layer, for example, is formed of nickel silicide. The metal silicide layer is not limited to the nickel silicide, and a metal silicide such as platinum silicide, nickel platinum silicide, and cobalt silicide may be employed.

In addition, the gate electrode 26 may be formed in a laminated structure which includes a single layer made of a metal semiconductor compound such as the metal silicide, a metal layer such as titan nitride (TiN), tungsten (W), and tantalum carbide (TaC), and a layer made of a metal semiconductor compound other than the metal silicide and a semiconductor such as the polycrystalline silicon layer, a laminated structure which is formed of a metal layer and a semiconductor such as the polycrystalline silicon layer, or the like.

On both sides of the gate electrode 26, gate sidewalls 28 are formed to interpose the gate electrode 26 therebetween. The gate sidewall 28 is an insulator, for example, a silicon nitride film, a silicon oxide film, or a laminated layer which is formed of the silicon nitride film and the silicon oxide film.

In the nanowire transistor according to the embodiment, the p-type impurity concentration of the semiconductor substrate 10 located directly below the narrow portion 16, in particular directly below the channel region 20, is made higher than the p-type impurity concentration of the channel region 20 located directly below the narrow portion 16 in particular directly below the gate electrode 26. In addition, the p-type impurity concentration of the semiconductor substrate 10 located directly below the narrow portion 16 is made higher than the impurity concentration of the semiconductor substrate 10 located directly below the wide portions 18a and 18b.

A high concentration region 10a and a low concentration region 10b are provided inside the semiconductor substrate 10. The semiconductor substrate 10 located directly below the narrow portion 16 in particular directly below the channel region 20 is formed of the high concentration region 10a. In addition, the semiconductor substrate 10 located directly below the wide portions 18a and 18b is formed of the low concentration region 10b.

Further, as illustrated in FIG. 4, the boundaries between the high concentration region 10a and the low concentration region 10b below the wide portions 18a and 18b are formed further inside the wide portions 18a and 18b from the edge portions of the wide portions 18a and 18b. A separated distance of the edge portions of the wide portions 18a and 18b from the boundaries between the high concentration region 10a and the low concentration region 10b in the horizontal direction is about 1 nm to 100 nm. The boundary between the high concentration region 10a and the low concentration region 10b is assumed to be a position in which the impurity concentration begins to rise in a direction going from the low concentration region 10b to the high concentration region 10a.

The nanowire transistor is required to be adjusted in its threshold voltage without degrading the characteristics of the transistor. In the nanowire transistor according to the embodiment, the p-type impurity concentration of the channel region 20 is kept in a relatively low concentration. And make the p-type impurity concentration of the semiconductor substrate 10 directly below the channel region 20 relatively high.

Through making the p-type impurity concentration of the p-type semiconductor substrate 10 high, a difference in work function between the channel region 20 and the semiconductor substrate 10 increases, and thus the threshold voltage of the nanowire transistor rises. In this way, the threshold voltage of the nanowire transistor is adjusted.

In addition, by making the p-type impurity concentration of the p-type semiconductor substrate 10 high, the p-type semiconductor substrate 10 is suppressed from being depleted when a back gate bias is applied to the p-type semiconductor substrate 10. Therefore, it is possible to effectively adjust the threshold voltage of the nanowire transistor by the application of the back gate bias.

On the other hand, the p-type impurity concentration of the channel region 20 is kept low. Therefore, a decrease in on-state current caused by scattering of charge carriers through the channel due to the impurity and a variability in the threshold voltage caused by a variability in the impurity concentration of the channel region 20 are suppressed.

Furthermore, through making the p-type impurity concentration of the semiconductor substrate below the wide portions 18a and 18b low, the width of a depletion layer spreading into the semiconductor substrate 10 is widened compared with the case in which the substrate is made to be in a high concentration. Therefore, a parasitic capacitance between the source-drain region 22 and the semiconductor substrate 10 can be reduced, and thus a high-performance nanowire transistor is realized.

As described above, the p-type impurity concentration of the channel region 20, for example, is $5E15$ $cm^{-3}$ or more and $1E18$ $cm^{-3}$ or less. From the viewpoint of suppressing the scattering of the charge carriers caused by the impurity and the variability in the threshold voltage, it is preferable that the p-type impurity concentration of the channel region 20 be $1E17$ $cm^{-3}$ or less.

The p-type impurity concentration of the high concentration region 10a, for example, is $1E18$ $cm^{-3}$ or more and $1E21$ $cm^{-3}$ or less. It is preferable that the p-type impurity concentration of the high concentration region 10a be $1E19$ $cm^{-3}$ or more and $1E20$ $cm^{-3}$ or less. If the concentration is less than the range, there is a concern that the adjustment in the threshold voltage may be performed insufficiently. In addition, if the concentration is greater than the region, there is a concern that it is difficult to realize the process of keeping the channel region 20 low.

The p-type impurity concentration of the low concentration region 10b, for example, is $5E15$ $cm^{-3}$ or more and $1E18$ $cm^{-3}$ or less. From the viewpoint of reducing the parasitic capacitance in the source-drain region 22, it is preferable that p-type impurity concentration of the low concentration region 10b be $1E17$ $cm^{-3}$ or less.

It is preferable that the p-type impurity concentration of the channel region 20 be lower than the p-type impurity concentration of the high concentration region 10a by one digit or more, and more preferably be lower by two digits or more. In addition, it is preferable that the p-type impurity concentration of the low concentration region 10b be lower than the p-type impurity concentration of the high concentration region 10a by one digit or more, and more preferably be lower by two digits or more. This is to make the high performance of the nanowire transistor well balanced with the adjustment in the threshold voltage.

Further, the impurity concentration, for example, can be measured using a SIMS (Secondary Ion Mass Spectrometry).

In addition, as described above, the height of the narrow portion 16 is 1 nm or more 40 nm or less, for example.

In a case where the height of the narrow portion 16 is lowered, the controllability of the threshold voltage using the back gate bias is improved. Therefore, it is preferable that the height of the narrow portion 16 be 25 nm or less, and more preferably be 15 nm or less.

Further, the height and the width of the narrow portion 16, for example, can be measured using a TEM (Transmission Electron Microscope).

As described above, the film thickness of the buried insulating layer, for example, is 3 nm or more and 50 nm or less. The controllability of the threshold voltage using the back gate bias is improved in a case where the film thickness of the buried insulating layer is small. From the viewpoint of raising the controllability of the threshold voltage using the back gate bias to make the threshold voltage adjusted with ease, it is preferable that the film thickness of the buried insulating layer be 25 nm or less, more preferably be 10 nm or less, and still more preferably be 5 nm or less.

Further, the film thickness of the buried insulating layer, for example, can be measured using the TEM.

Figure 6:
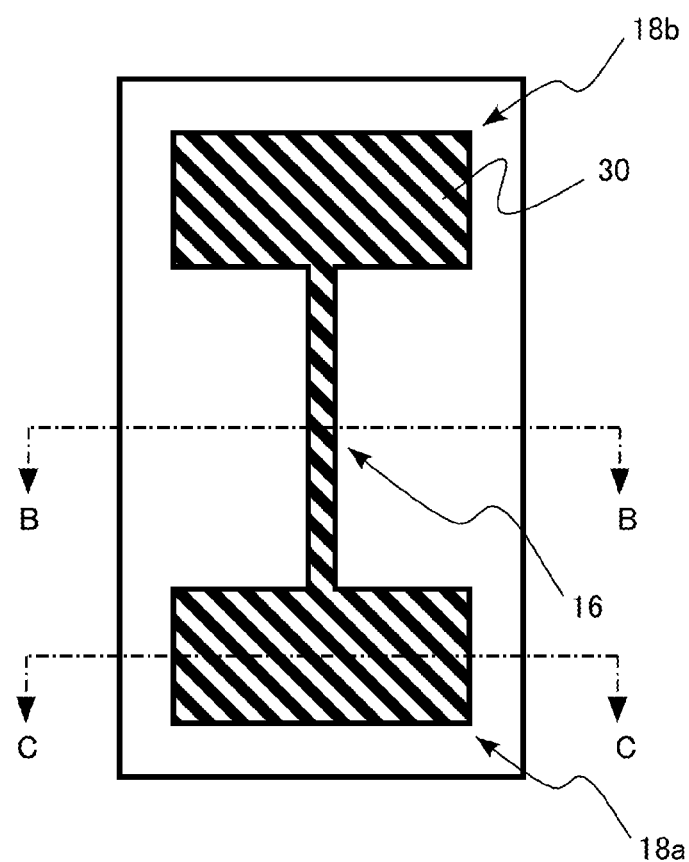
FIG. 6 is a diagram illustrating a procedure in a method of manufacturing the semiconductor device according to the first embodiment.

Next, a method of manufacturing the semiconductor device according to the embodiment will be described. FIGS. 5 to 9 are diagrams illustrating a procedure in the method of manufacturing the semiconductor device according to the embodiment. FIGS. 5, 7, 3, and 9 are cross-sectional views. FIG. 6 is a top view.

A method of manufacturing the semiconductor device in the embodiment includes preparing a substrate which includes a semiconductor substrate, a buried insulating layer formed on the semiconductor substrate, and a semiconductor layer on the buried insulating layer, or the described-above structure formed using the semiconductor substrate, forming a mask layer on the semiconductor layer, patterning the mask layer, patterning the semiconductor layer using the patterned mask layer as a mask such that a narrow portion and two wide portions are formed, the wide portions being formed larger than the narrow portion in width and being connected to one end and the other end of the narrow portion, ion-implanting an impurity into the semiconductor substrate using the mask layer as a mask, forming a gate insulating film on the narrow portion after the impurity is ion-implanted, and forming a gate electrode on the gate insulating film.

First, a substrate 50 is prepared which is provided with the semiconductor substrate 10, the buried insulating layer 12 on the semiconductor substrate 10, and the semiconductor layer 14 on the buried insulating layer 12. In other words, for example, an SOI (Silicon On Insulator) substrate is prepared. Alternatively, for example, the semiconductor substrate 10 is subjected to thermal oxidation to form the buried insulating layer 12 thereon and then the semiconductor layer 14 is deposited, thereby preparing the substrate 50 which is formed to have the structure described above. The semiconductor substrate 10, for example, is the p-type (100)-plane silicon substrate. The p-type impurity concentration of the semiconductor substrate 10, for example, is $5E15$ $cm^{-3}$ or more and $1E17$ $cm^{-3}$ or less. The buried insulating layer 12, for example, is the silicon oxide film. The semiconductor layer 14, for example, is made of the p-type single-crystal silicon. The p-type impurity concentration of the semiconductor layer 14 is substantially equal to that of the semiconductor substrate 10, for example, $5E15$ $cm^{-3}$ or more and $1E17$ $cm^{-3}$ or less.

Then, a mask layer 30 is formed on the semiconductor layer 14. The mask layer 30, for example, is a silicon nitride film. Instead of the silicon nitride film, for example, the silicon oxide film or a resist film may be used. The shape of the cross section after the formation of the mask layer 30 is illustrated using a cross section (an A-A cross section) of the gate length direction of FIG. 5.

Next, the mask layer 30, for example, is patterned through a lithography method and a dry etching method. Then, using the patterned mask layer 30 as a mask, the semiconductor layer 14, for example, is patterned through the dry etching method.

At this time, the semiconductor layer 14 is patterned so as to be provided with the narrow portion 16 and the two wide portions 18a and 18b which are formed larger than the narrow portion 16 in width and are connected to one end and the other end of the narrow portion 16.

Figure 7A:
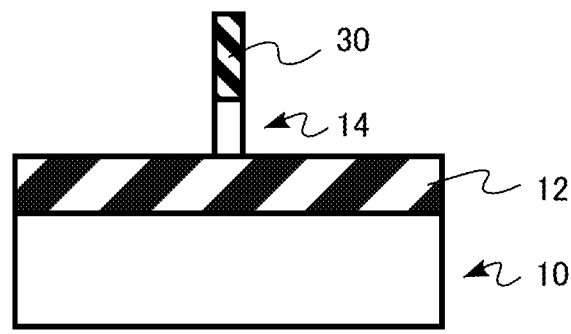
FIGS. 7A and 7B are diagrams illustrating the procedure in the method of manufacturing the semiconductor device according to the first embodiment.
Figure 7B:
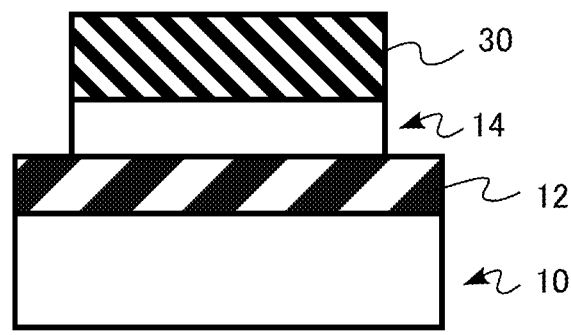

FIG. 6 illustrates a top view of the patterned semiconductor layer 14. FIGS. 7A and 7B are cross-sectional views of the patterned semiconductor layer 14. FIG. 7A is a cross-sectional view illustrating a B-B cross section, and FIG. 7B is a cross-sectional view illustrating a C-C cross section.

Figure 8A:
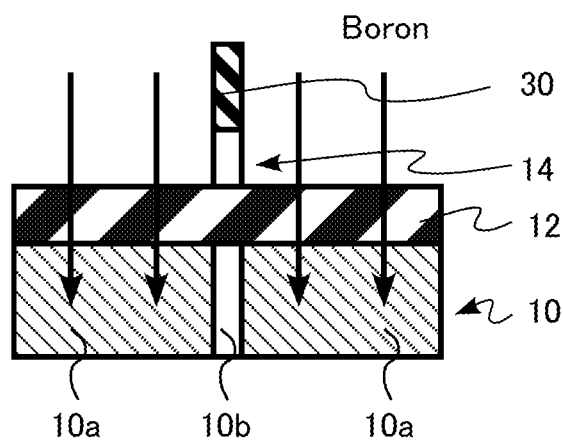
FIGS. 8A and 8B are diagrams illustrating the procedure in the method of manufacturing the semiconductor device according to the first embodiment.
Figure 8B:
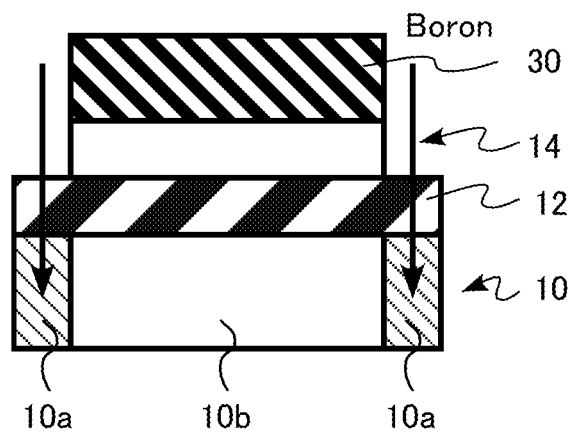

Next, as illustrated in FIGS. 8A and 8B, an impurity is ion-implanted into the semiconductor substrate 10 using the mask layer 30 as a mask. FIG. 8A is a cross-sectional view illustrating a B-B cross section, and FIG. 8B is a cross-sectional view illustrating a C-C cross section. An example of the impurity is boron (B) which is a p-type impurity.

The high concentration region 10a which is ion-implanted with the impurity ions is formed in the region of the semiconductor substrate 10 of which the upper surface is not covered with the mask layer 30. On the other hand, the region of the semiconductor substrate 10 of which the upper surface is covered with the mask layer 30 is not ion-implanted with the impurity ions, or even so just a little bit, and thus becomes the low concentration region 10b. In addition, the semiconductor layer 14 of which the upper surface is covered with the mask layer 30, for example, the narrow portion 16 is also not ion-implanted with the impurity ions, or even so just a little bit, and thus the impurity concentration is kept low.

In this way, through the ion implantation of the impurity, the impurity concentration of the semiconductor substrate 10 in the region which is not covered with the mask layer 30 after the patterning of the mask layer 30 is made to be higher than the impurity concentration of the narrow portion 16. For this reason, it is preferable that a projected range (Rp) of the ion implantation fall within the mask layer 30. In addition, it is preferable that a forming condition be set to make the Rp of the ion implantation fall within the semiconductor substrate 10 instead of the buried insulating layer 12 of which the upper surface is not covered with the mask layer 30.

In addition, it is preferable that the ion implantation of the impurity be performed in a substantially vertical direction with respect to the semiconductor substrate 10. In other words, a tilt angle of the ion implantation is preferably in a range of 0±1 degree, and more preferably 0 degree. This is to suppress the introduction of the impurity from the side surface of the narrow portion 16 into the narrow portion 16.

Next, thermal treatment is performed to make the ion-implanted impurity in the semiconductor substrate 10 activated and diffused thereinto. The thermal treatment, for example, is performed in an inert gas at 900° C. to 1100° C. for 10 sec to 150 sec through an RTA (Rapid Thermal Annealing) method or the like.

Figure 9A:
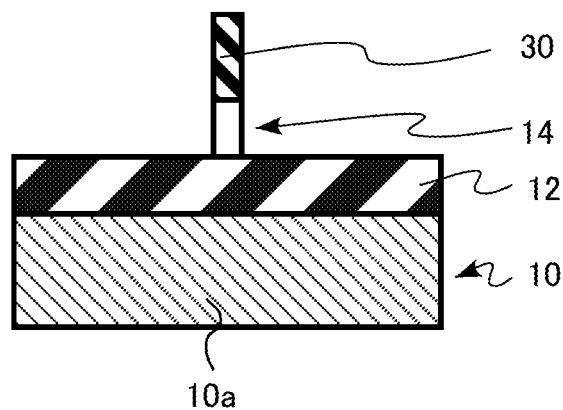
FIGS. 9A and 9B are diagrams illustrating the procedure in the method of manufacturing the semiconductor device according to the first embodiment.
Figure 9B:
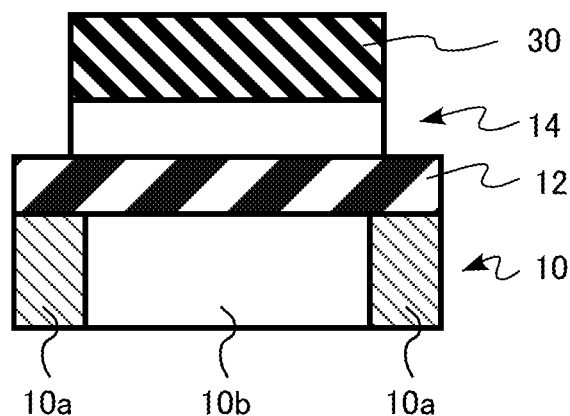

FIGS. 9A and 9B illustrate the cross sections after the thermal treatment. FIG. 9A is a cross-sectional view illustrating a B-B cross section, and FIG. 9B is a cross-sectional view illustrating a C-C cross section. As illustrated in FIG. 9A, through the thermal treatment, the impurity is diffused in the semiconductor substrate 10 below the narrow portion 16 to make the high concentration regions 10a be in contact from the both sides, so that the low concentration region 10b disappears and only the high concentration region 10a is left.

On the other hand, as illustrated in FIG. 9B, in the semiconductor substrate 10 below the wide portions 18a and 18b, the high concentration regions 10a are extended further inside from the end portions of the wide portions 18a and 18b due to the diffusion of the impurity, but the both sides are not in contact with each other and thus the low concentration region 10b remains.

As described above, the width of the narrow portion 16, for example, is 1 nm or more and 25 nm or less. In the thermal treatment at low temperature for a short time, it is preferable that the width of the narrow portion 16 be 20 nm or less, and more preferably be 10 nm or less to make sure that the high concentration regions 10a are in contact with each other from the both sides.

Figure 10A:
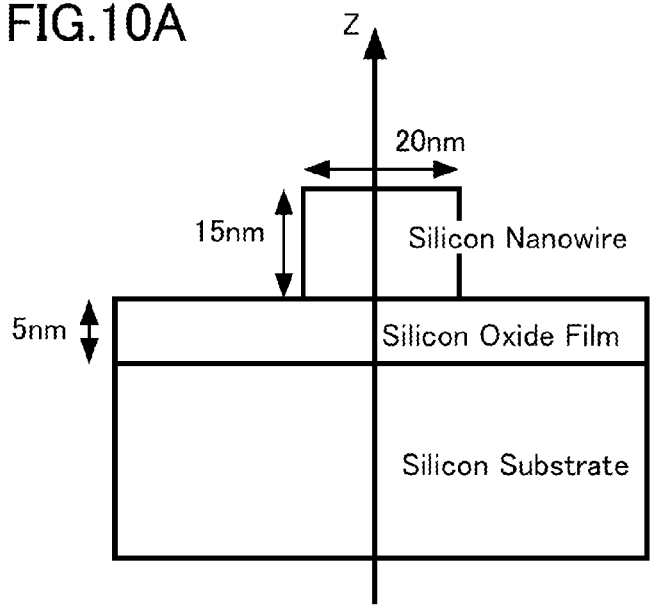
FIGS. 10A and 10B are diagrams illustrating a simulation result of the method of manufacturing the semiconductor device according to the first embodiment.
Figure 10B:
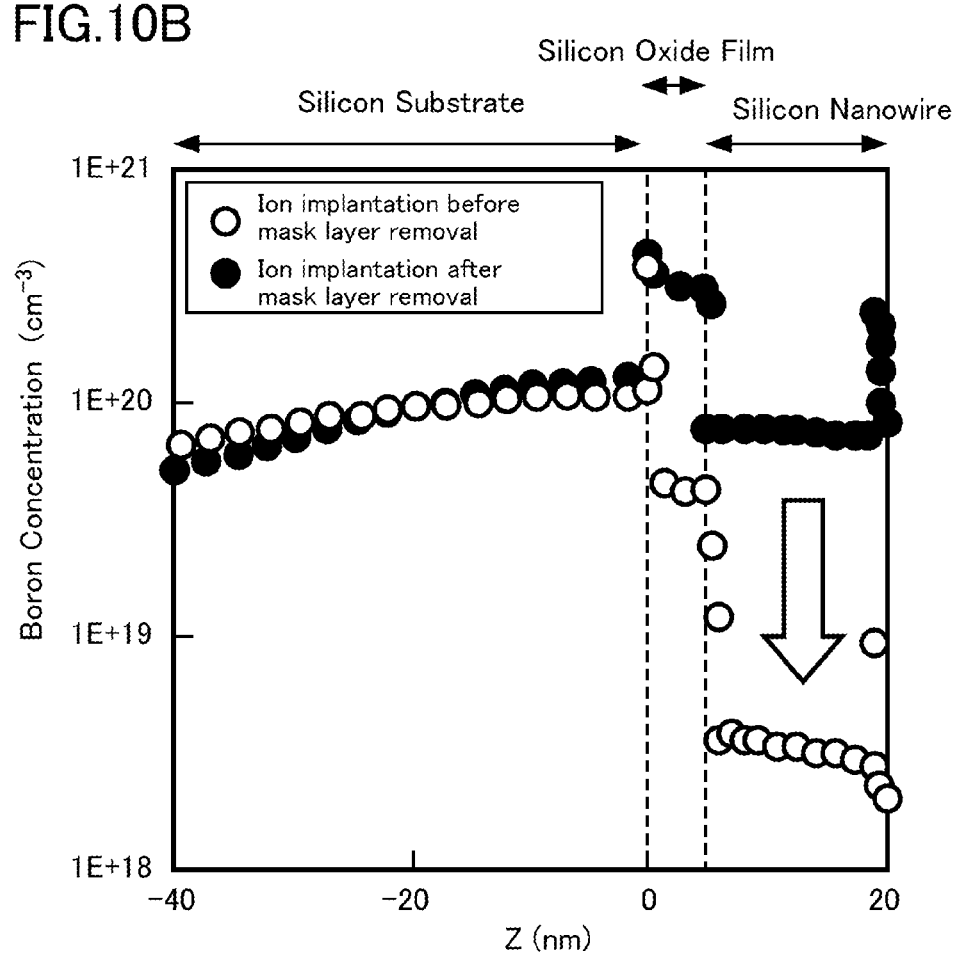

FIGS. 10A and 10B are diagrams illustrating a simulation result of the method of manufacturing the semiconductor device according to the embodiment. FIG. 10A is a cross-sectional view illustrating the structure of an element on which the simulation is performed, and FIG. 10B is concentration distribution of the impurity which is obtained as a result of the simulation.

A silicon nanowire (the narrow portion) was prepared of which the width was 20 nm and the height was 15 nm. The silicon oxide film was employed as the buried insulating layer of which the thickness was 5 nm. The silicon nitride film was employed as the mask layer of which the thickness was 60 nm. The ion implantation was performed using boron (B) under 5 keV applied over the region of 1E15 $cm^{-2}$. The annealing was performed as the thermal treatment after the ion implantation at 1035° C. for 120 sec.

In FIG. 10B, white circles represent the manufacturing method according to the embodiment, that is, the case where the ion implantation is performed before the mask layer is peeled off. Black circles represent the case where the ion implantation is performed after the mask layer is peeled off.

As is obvious from FIG. 10B, in the manufacturing method according to the embodiment, the impurity concentration in the nanowire is reduced by one digit or more compared with the case of performing the ion implantation after peeling off the mask layer. On the other hand, since the semiconductor substrate directly below the nanowire is ion-implanted and then subjected to the thermal treatment for diffusing the impurity, the concentration of the semiconductor substrate directly below the nanowire becomes high.

Then, after removing the mask layer 30, the gate insulating film 24 is formed on the side surface and the upper surface of the narrow portion 16. The gate insulating film 24, for example, is the silicon oxide film. In addition, the gate insulating film 24 is not limited to the silicon oxide film, and a high permittivity film (high-k film) or the like may be employed.

Next, the polycrystalline silicon layer is formed on the gate insulating film 24 to form the gate electrode 26, and a hard mask layer of the silicon nitride film, for example, is formed on the polycrystalline silicon layer. Then, the hard mask layer is patterned.

Next, the polycrystalline silicon layer and the gate insulating film 24 are patterned using the hard mask layer as a mask. Then, the polycrystalline silicon layer of the gate electrode 26 and the gate insulating film 24 are left on only a part of the narrow portion 16.

Next, for example, after the silicon nitride film is deposited on the entire surface, the gate sidewall 28 is formed on the both side of the gate electrode 26 through the dry etching method. The thickness of the gate sidewall 28 in the gate length direction, for example, is about 5 nm to 30 nm.

Next, for example, the ion implantation is performed with arsenic (As) which is the n-type impurity, and the source-drain region 22 of the n-type diffusion layer is formed.

After the ion implantation, the thermal treatment is performed to activate the impurity and to restore the crystallinity of the semiconductor layer 14. Further, before or after the ion implantation, a silicon layer having a thickness of about several tens nanometers is formed on the source-drain region 22 through an epitaxial growth, so that it is possible to achieve the reduction of the parasitic resistance.

The nanowire transistor illustrated in FIGS. 1 to 4 has been manufactured through the above-described manufacturing method. Thereafter, metal interconnections and the like are formed on the upper layer through a known manufacturing method.

Hereinbefore, according to the embodiment, the impurity concentration of the semiconductor substrate 10 below the channel region can be made high while keeping the impurity concentration of the channel region of the nanowire low. Therefore, while suppressing the decrease in on-state current and the variability in the threshold voltage, the threshold voltage of the nanowire transistor can be adjusted with ease.

At the same time, since the impurity concentration of the semiconductor substrate 10 below the source-drain region 22 can be kept low, the parasitic capacitance between the source-drain region 22 and the semiconductor substrate 10 is reduced. Therefore, a high-performance nanowire transistor can be manufactured.

Hereinbefore, according to the semiconductor device and the method of manufacturing the semiconductor device in the embodiment, there can be provided the semiconductor device of which the threshold voltage is adjusted and the performance is high and the manufacturing method thereof.

(Second Embodiment)

A semiconductor device according to the embodiment is similar to that of the first embodiment except that the boundary between a high concentration region and a low concentration region of a semiconductor substrate is positioned directly below the edge portion of the wide portion. Therefore, the descriptions duplicated with those in the first embodiment will not be repeated.

Figure 11:
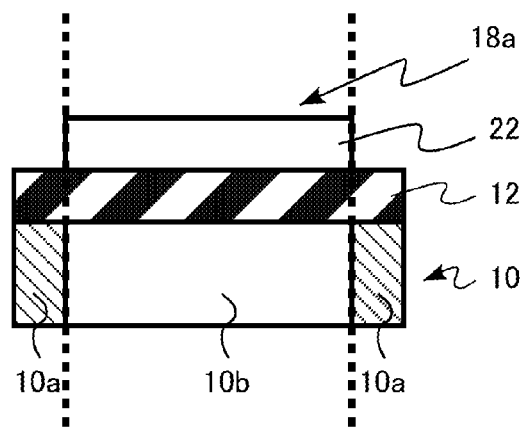
FIG. 11 is a cross-sectional view illustrating a semiconductor device according to a second embodiment.

FIG. 11 is a cross-sectional view illustrating the semiconductor device according to the embodiment. FIG. 11 illustrates a cross section of the source-drain region (a C-C cross section) in the gate width direction. As illustrated in FIG. 11, the boundary between the high concentration region 10a and the low concentration region 10b is provided at the position directly below the edge portion of the wide portion 18a. Herein, a separated distance between the position directly below the edge portion of the wide portion 18a and the boundary between the high concentration region 10a and the low concentration region 10b in the horizontal direction is assumed to have an allowable error within about 20 nm.

Figure 12:
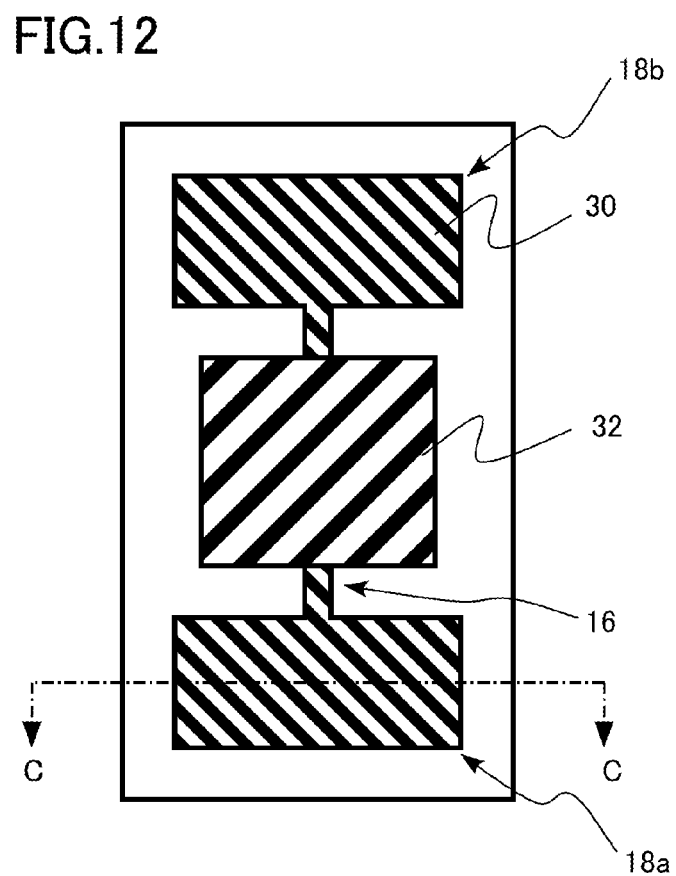
FIG. 12 is a top view illustrating a method of manufacturing the semiconductor device according to the second embodiment.

FIG. 12 is a top view illustrating a method of manufacturing the semiconductor device according to the embodiment. FIG. 12 illustrates a state in which a mask layer (a second mask layer) 32 for the ion implantation is formed on the mask layer (a first mask layer) 30 after patterning the mask layer 30 and the semiconductor layer 14 in order to control the diffusing of the impurity. The mask layer 32 for the ion implantation, for example, is a photoresist.

The mask layer (the second mask layer) 32 may be formed either before or after the ion implantation for controlling the diffusion of the impurity as long as it is before the thermal treatment for activating and diffusing the impurity to densify the semiconductor substrate 10.

The mask layer (the second mask layer) 32 is formed such that at least a channel region which is a part of the narrow portion 16 is covered and the edge portions of the wide portions 18a and 18b are exposed. Fluorine (F), germanium (Ge), or carbon (C) is ion-implanted using the mask layer (the second mask layer) 32 as a mask.

In the thermal treatment for activating and diffusing the impurity, for example, boron (B) to densify the semiconductor substrate 10, since fluorine (F), germanium (Ge), or carbon (C) coexists with boron (B), the diffusion of boron is suppressed in the semiconductor substrate 10. Therefore, the boron is suppressed from being diffused from the edge portions of the wide portions 18a and 18b, that is, the edge portions of the source-drain region 22 to the inside. Accordingly, the impurity profile immediately after the ion implantation is maintained, and the position of the boundary between the high concentration region 10a and the low concentration region 10b is maintained at the position directly below the edge portions of the wide portion 18a.

After the thermal treatment, the manufacturing proceeds in a similar way to the first embodiment.

According to the semiconductor device and the method of manufacturing the semiconductor device in the embodiment, since the overlapping between the source-drain region 22 and the high concentration region 10a of the semiconductor substrate 10 is reduced, the parasitic capacitance between the source-drain region 22 and the semiconductor substrate 10 is further reduced. Therefore, in addition to the effect of the first embodiment, the semiconductor device having a higher performance can be realized.

(Third Embodiment)

A semiconductor device according to the embodiment is similar to that of the first embodiment except that a plurality of the narrow portions are present. Therefore, the descriptions duplicated with those in the first embodiment will not be repeated.

Figure 13:
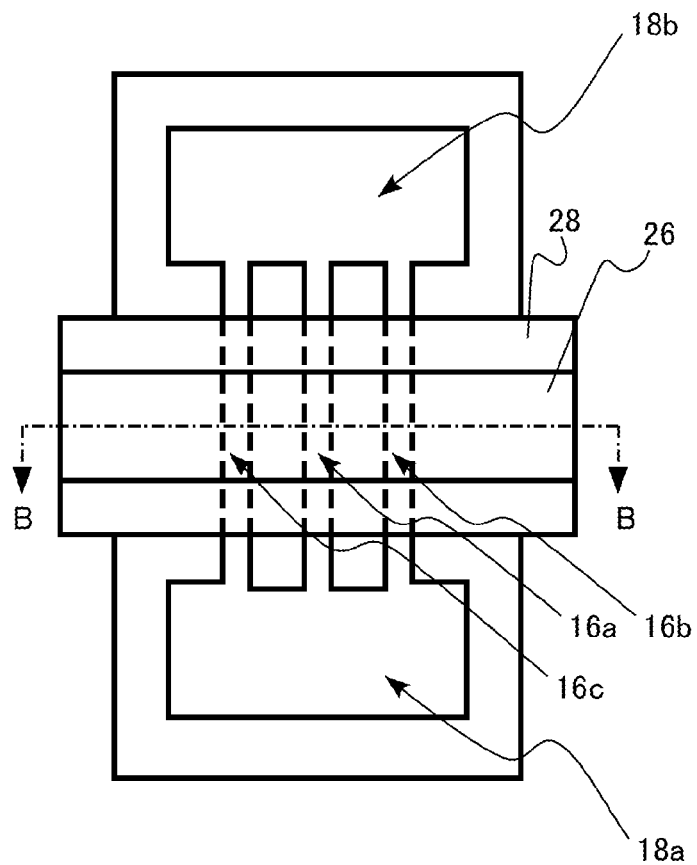
FIG. 13 is a top view illustrating a semiconductor device according to a third embodiment.
Figure 14:
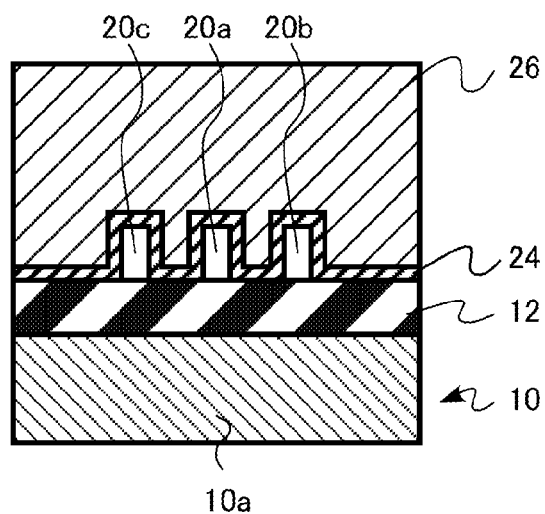
FIG. 14 is a cross-sectional view illustrating a B-B cross section of FIG. 13.

FIG. 13 is a top view illustrating the semiconductor device according to the embodiment. FIG. 14 is a cross-sectional view illustrating a B-B cross section of FIG. 13.

As illustrated in the drawing, the three narrow portions 16a, 16b, and 16c which are disposed in parallel to each other are provided, in which channel regions 20a, 20b, and 20c are provided respectively. The wide portions 18a and 18b which form the source-drain region 22 are connected to one end and the other end of each channel region.

According to the semiconductor device in the embodiment, the semiconductor device which has an increased driving force can be realized in addition to the effect of the first embodiment.

Further, the number of the narrow portions is not limited to three, and may be two, four, or more.

(Fourth Embodiment)

A semiconductor device according to the embodiment is similar to that of the first embodiment except that the semiconductor device is a fin-type transistor in which the gate insulating film is formed only on the side surface of the narrow portion. Therefore, the descriptions duplicated with those in the first embodiment will not be repeated.

Figure 15:
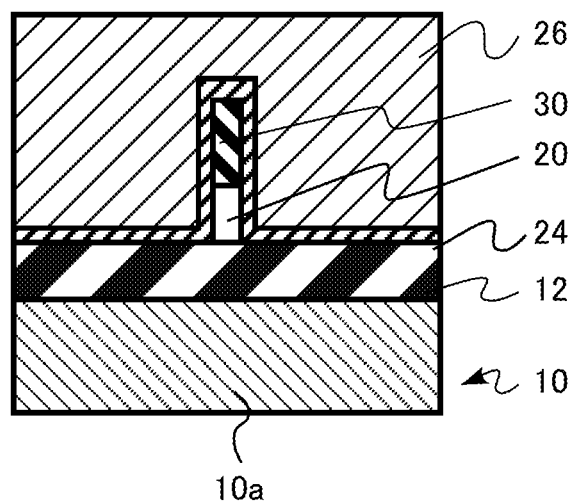
FIG. 15 is a cross-sectional view illustrating a semiconductor device according to a fourth embodiment.

FIG. 15 is a cross-sectional view illustrating the semiconductor device according to the embodiment. FIG. 15 illustrates a cross section (a B-B cross section) of the gate electrode portion in the gate width direction. As illustrated in FIG. 15, the semiconductor device according to the embodiment is the fin-type transistor in which the gate insulating film 24 is formed only on the side surface of the channel region 20 of the narrow portion.

The fin-type transistor can be manufactured in a state where, for example, the mask layer 30 is not peeled off before the formation of the gate insulating film 24 in the first embodiment.

Even through the semiconductor device and the method of manufacturing the semiconductor device in the embodiment, there can be provided the semiconductor device of which the threshold voltage is adjusted and the performance is high and the manufacturing method thereof.

In the embodiment, the n-type transistor in which electrons serve as carriers has been described as an example, but present disclosure may be applied to the p-type transistor in which holes serve as the carriers. In this case, for example, instead of the p-type impurity, the n-type impurity is ion-implanted into the substrate to form the high concentration region. For example, phosphorus (P) or arsenic (As) is employed as the n-type impurity.

While certain embodiments have been described, these embodiments have been presented by way of example only, and are not intended to limit the scope of the inventions. Indeed, the semiconductor device and the method of manufacturing the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
   a semiconductor substrate;
   a buried insulating layer formed on the semiconductor substrate;
   a semiconductor layer formed on the buried insulating layer, the semiconductor layer includes a narrow portion and two wide portions which are larger than the narrow portion in width and are respectively connected to one end and the other end of the narrow portion;
   a gate insulating film formed on a sidewall surface of the narrow portion; and
   a gate electrode formed on the gate insulating film,
   wherein an impurity concentration of the semiconductor substrate directly below the narrow portion is higher than an impurity concentration of the narrow portion, and
   the impurity concentration of the semiconductor substrate directly below the narrow portion is higher than an impurity concentration of the semiconductor substrate directly below the two wide portions.

2. The device according to claim 1, wherein the impurity concentration of the semiconductor substrate directly below the narrow portion is $1E18$ $cm^{-3}$ or more and $1E21$ $cm^{-3}$ or less.

3. The device according to claim 1, wherein a film thickness of the buried insulating layer is 3 nm or more and 25 nm or less.

4. The device according to claim 1, wherein the gate insulating film is formed on an upper surface of the narrow portion.

5. The device according to claim 1, wherein the impurity concentration of the narrow portion and the impurity concentration of the semiconductor substrate directly below the two wide portions are lower than the impurity concentration of the semiconductor substrate directly below the narrow portion by one order of magnitude or more.

6. The device according to claim 1, wherein the impurity concentration of the narrow portion is $5E15$ $cm^{-3}$ or more and $1E18$ $cm^{-3}$ or less.

7. The device according to claim 1, wherein the impurity concentration of the semiconductor substrate directly below the narrow portion is $5E15 cm^{-3}$ or more and $1E18$ $cm^{-3}$ or less.

8. The device according to claim 1, wherein a height of the narrow portion is 25 nm or less.

9. The semiconductor device according to claim 1, wherein the semiconductor substrate and the semiconductor layer are made of silicon.

10. The semiconductor device according to claim 1, wherein the gate insulating film is silicon oxide film.

* * * * *